United States Patent

Diaz et al.

[15] 3,707,713

[45] Dec. 26, 1972

[54] HIGH RESOLUTION PULSE RATE MODULATED DIGITAL-TO-ANALOG CONVERTER SYSTEM

[72] Inventors: Richard A. Diaz, Pittsburgh; Andras I. Szabo, Export, both of Pa.

[73] Assignee: Westinghouse Electric Corporation, Pittsburgh, Pa.

[22] Filed: Oct. 13, 1970

[21] Appl. No.: 80,358

[52] U.S. Cl. .......... 340/347 DA

[51] Int. Cl. .......... H03k 13/02

[58] Field of Search .......... 340/347 DA

[56] References Cited

UNITED STATES PATENTS

| | | | |
|---|---|---|---|
| 3,447,149 | 5/1969 | Groth | 340/347 DA |
| 3,435,196 | 3/1969 | Schmid | 340/347 DA |
| 3,573,803 | 4/1971 | Chatelon | 340/347 DA |
| 3,576,575 | 4/1971 | Hellwarth | 340/347 DA |
| 3,497,625 | 2/1970 | Hileman | 340/347 DA |

*Primary Examiner*—Maynard R. Wilbur
*Assistant Examiner*—Jeremiah Glassman
*Attorney*—F. H. Henson, R. G. Brodahl and J. J. Wood

[57] ABSTRACT

This disclosure relates to a pulse rate modulated digital-to-analog converter system which translates the digital information into a train of identical pulses, with the pulse rate proportional to the digital data. The pulse train produced by the encoder drives an analog switch, which in cooperation with a filtering analog circuit, converts the pulse train to an analogous DC voltage.

4 Claims, 6 Drawing Figures

INVENTORS
Ricardo A. Diaz &
Andras I. Szabo.
BY James J. Wood
ATTORNEY

HIGH RESOLUTION PULSE RATE MODULATED DIGITAL-TO-ANALOG CONVERTER SYSTEM

BACKGROUND OF THE INVENTION

1. Field of the Invention

This invention relates to a high resolution pulse rate modulated digital-to-analog converter system.

2. Description of the Prior Art:

The direct type digital-to-analog converter, converts directly from digital data intelligence into an analog voltage. In digital-to-analog converters of this type, a common arrangement is the current summing network. This technique requires the use of precision resistors with carefully controlled tolerances. Another type of direct digital-to-analog converter is the R-2R ladder network which has the distinct advantage that only two precise resistors need be selected. The advantages of both of these techniques reside in the fact that quick switching is realized, and the output very rapidly settles down to a steady state value. This is particularly of advantage where speed is of paramount importance such as encountered in many military applications.

The instant invention relates to the somewhat slower indirect type of digital-to-analog converter wherein the digital information is first converted into an intermediate encoded digital signal and then into a DC voltage through an averaging process. This is known in the art as pulse duration or pulse width modulation technique. In those applications where the speed is not quite as important, this slower system may be used with concomitant greater accuracy.

SUMMARY OF THE INVENTION

In accordance with the instant invention means are provided for generating intermediate encoded digital pulses which are a function of binary digital data located in stored digital intelligence means. Means are also provided for generating synchronized pulses which are synchronized with the intermediate encoded digital pulses, each pulse having a time width duration which is less than, and wholly contained within, the time width duration of the corresponding intermediate encoded digital pulse.

Means are provided for logically AND gating the intermediate encoded digital and the synchronized pulses, to deliver a digital pulse train output which is a function of the stored binary digits.

Finally, means are arranged for receiving and filtering the digital pulse train output to deliver an analog signal.

DESCRIPTION OF EXEMPLARY EMBODIMENT

Figure 1:
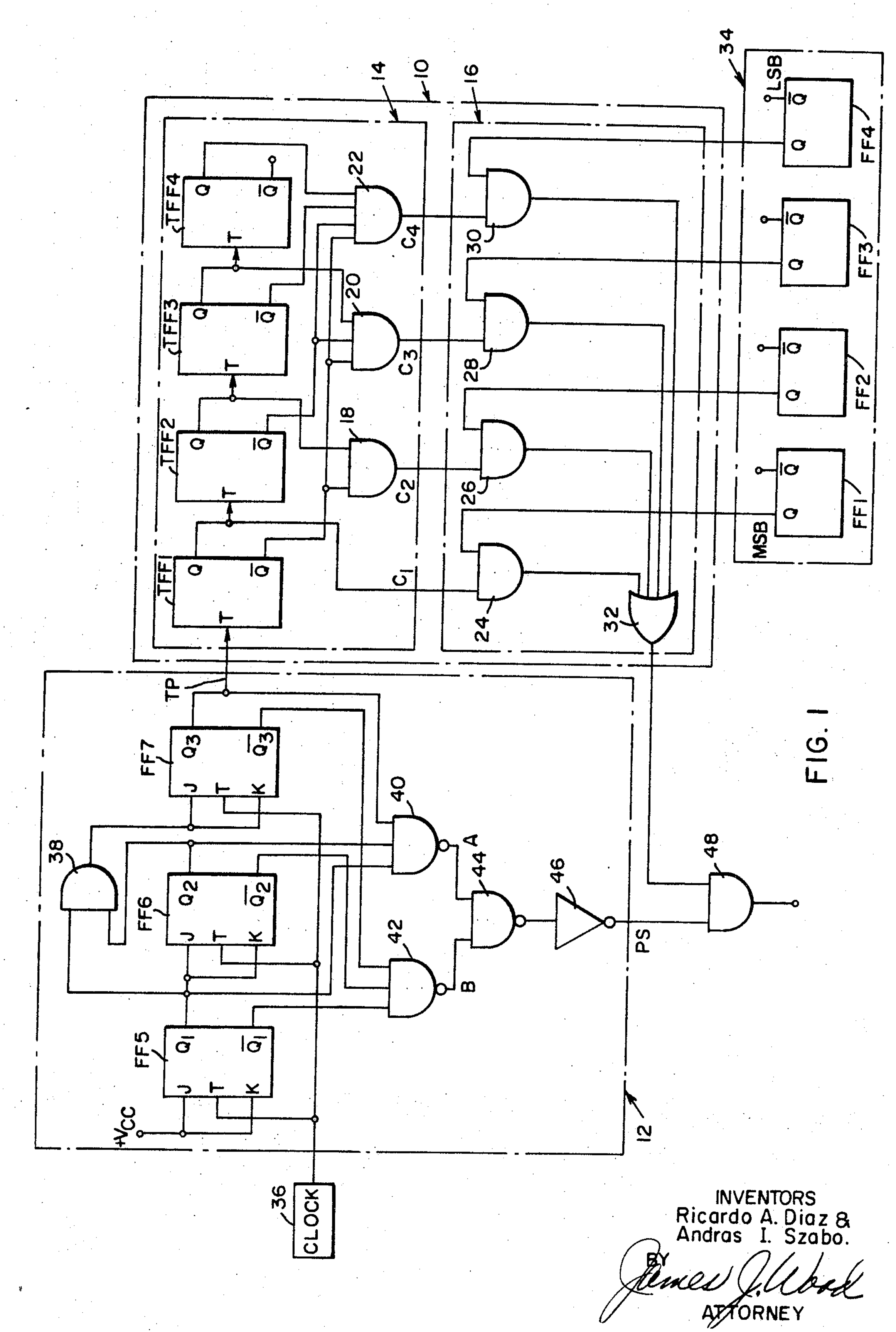
FIG. 1 is an illustrative electrical schematic of the high resolution pulse rate modulated digital-to-analog converter system in accordance with the invention for handling four bits of information.

The high-resolution pulse-rate modulated digital-to-analog converter system in accordance with this invention is illustrated in FIG. 1. In the interests of simplicity, the system is depicted using four bits of information, although it will be appreciated that the system can be expanded to include all the bits required in a practical environment. The digital-to-analog converter system comprises, a basic encoder indicated generally at 10, and a synchronized pulse shaper circuitry indicated generally at 12. The basic encoder 10 comprises two component parts: (a) a commutator indicated generally at 14, and (b) a pulse binary comparator indicated generally at 16.

The commutator 14 comprises four trigger flip-flops: TFF1, TFF2, TFF3, TFF4 and three AND gates, 18, 20, and 22. Each respective trigger flip-flop TFF1, TFF2, TFF3 and TFF4 receives the triggering pulse at terminal T, and has dual outputs identified as $\overline{Q}$ and $\overline{Q}$. The Q output is the complement of Q, i.e., when Q is a logic ONE, $\overline{Q}$ is a logic ZERO and conversely.

The trigger flip-flops TFF1, TFF2, TFF3 and TFF4 function as a ripple counter. It will be noted that the Q output of TFF1 is connected to provide a trigger input pulse at T for TFF2, and it is also connected to provide one input, identified as C1 to an AND gate 24. The Q outputs of TFF2 and TFF3 are connected to form the triggering input pulse to T for TFF3 and TFF4, respectively, and also as one input to the AND gates 18 and 20, respectively. The last flip-flop TFF4 has its Q output connected at one input of the AND gate 22.

$\overline{Q}$ of TFF1 is connected as one input to AND gates 18, 20 and 22 respectively; similarly $\overline{Q}$ of TFF2 is connected as one input to AND gates 20 and 22 respectively. $\overline{Q}$ of TFF3 is connected as one input to the AND gate 22; $\overline{Q}$ of TFF4 is not utilized.

The pulse binary comparator 16 comprises four AND gates identified at 24, 26, 28 and 30, the respective outputs of which are connected to a logic OR gate indicated at 32.

The commutator 14 outputs, which are identified at lines C1, C2, C3 and C4, provide one input to the AND gates 24, 26, 28 and 30, respectively; the other input to the AND gates 24, 26, 28 and 30 is provided from a register indicated generally at 34. The register 34 comprises flip-flops FF1, FF2, FF3 and FF4, the Q outputs of each flip-flop providing an input to AND gates 24, 26, 28 and 30, respectively.

In the coding arrangement utilized, FF1 contains the most significant bit (MSB) and FF4 contains the least significant bit (LSB).

The synchronized pulse shaper circuitry 12 comprises three JK flip-flops: FF5, FF6 and FF7; these flip-flops have a trigger terminal at T, to which is applied pulses from a clock indicated symbolically at 36. The outputs of the flip-flops FF5, FF6 and FF7 are identified at $Q_1$, $\overline{Q_1}$; $Q_2$, $\overline{Q_2}$; and $Q_3$, $\overline{Q_3}$. The JK inputs of FF5 are connected in common to a source of voltage +Vcc. The JK inputs of flip-flops FF6 and FF7 are connected in common as shown; additionally the JK inputs of FF6 are connected to the $Q_1$ output of FF5 and to the input of an AND gate 38, and the JK inputs of FF7 are connected to the output of the AND gate 38.

The AND gate 38 has two inputs, one of which is connected to $Q_2$ and the other of which is connected to $Q_1$ as explained previously. Two logic NAND gates are identified at 40 and 42. As may be seen from the drawings the three inputs to NAND gate 40 are $Q_1$, $Q_2$ and $Q_3$, while the three inputs to NAND gate 42 are $\overline{Q_1}$, $\overline{Q_2}$ and $\overline{Q_3}$. For convenience in explaining the operation of the circuitry, the output of NAND gate 40 is identified at A, and the output of the NAND gate 42 is identified at B; the A and B outputs are then fed to a NAND gate 44, the output of which is applied to a logic inverter 46. The output of the logic inverter 46, identified as PS, is then fed as one input to a logic AND gate 48, the other output of the AND gate 48 being derived from the output of the logic OR gate 32 of the basic encoder 10.

OPERATION OF THE EMBODIMENT

Figures 4, 6:
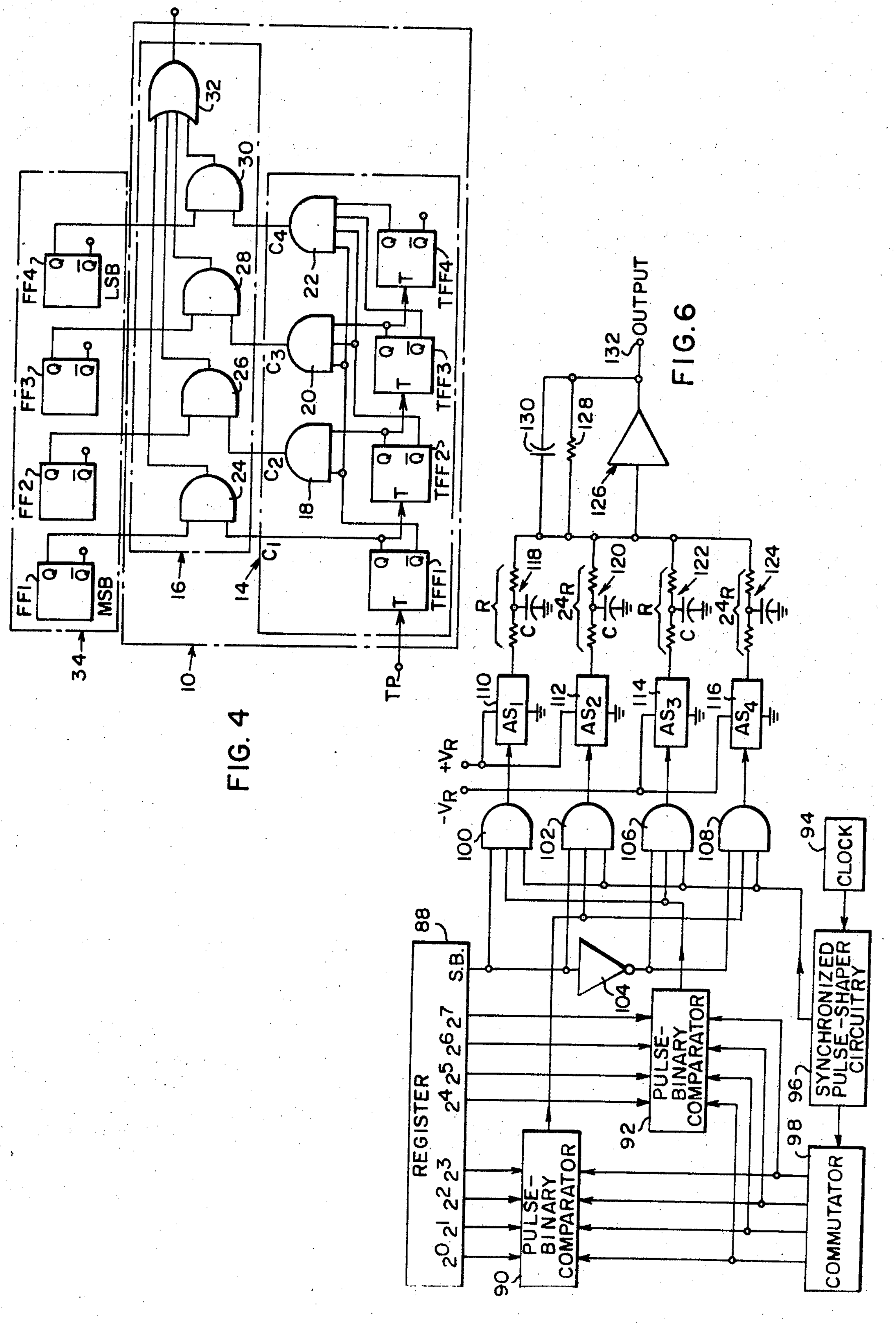
FIG. 4 is a circuit diagram showing the basic encoder.
FIG. 6 is a nine-bit high resolution pulse rate modulated digital-to-analog converter system in accordance with another embodiment of the invention.
Figure 5:
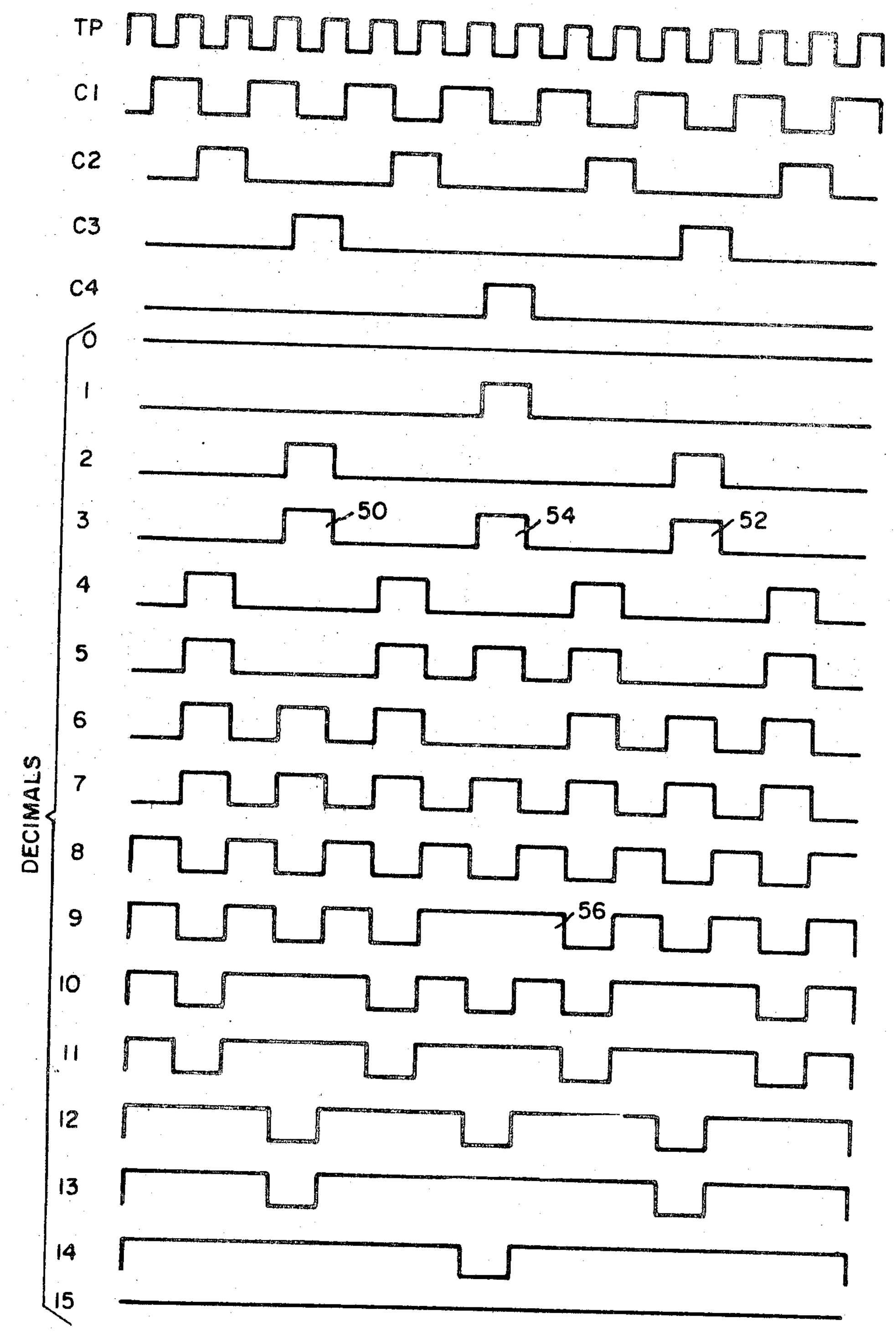
FIG. 5 is a series of waveforms used in explaining the operation of FIG. 4.

In order to appreciate the overall operation and the cooperation between the various component parts, reference will first be had to FIG. 4, which reproduces the basic encoder 10, and to FIG. 5 which depicts various waveforms used in explaining the operation of the FIG. 4 circuitry.

The trigger flip-flops TFF1, TFF2, TFF3 and TFF4 constitutes a ripple counter, the frequency of the clock pulses TP appearing at the first trigger terminal T of TFF1 being successively divided in half as the output of one TFF provides the input to the succeeding TFF. The output Q of TFF1 provides the pulse waveform identified at FIG. 5: C1. TFF2, TFF3 and TFF4 in cooperation with AND gates 18, 20 and 22 provided the waveforms identified in FIG. 5 at $C_2$, $C_3$ and $C_4$ respectively. An insight into the nature of this cooperation may be obtained from a consideration of TFF1, TFF2 and logic AND gate 18. The output of TFF1 FIG. 5: C1 is also the trigger input to TFF2, resulting in a pulse output at the Q terminal of TFF2, having a pulse width duration two times as great, and a frequency which is one half that of its trigger input. The AND gate 18 has two inputs: $\overline{Q}$ (the complement of Q of TFF1) and the Q output of TFF2. The AND gate 18 will only have an output when both its inputs are HIGH (ONE). Thus, even though Q of TFF2 has a pulse width which is twice that of $C_1$, the AND gate 18 will only deliver an output for one half this pulse width (because the other input will be LOW), resulting in the output depicted at FIG. 5: $C_2$, the pulse width of $C_2$ being exactly equal the time width of $C_1$.

Similarly, by the same rotationale, the AND gate 20 (which has three inputs) and the AND gate 22 (which has four inputs) cooperate with the associated TFF's to produce the pulse waveforms depicted in FIG. 5 at $C_3$ and $C_4$ respectively. As may be seen from a study of FIG. 5, the C1 pulse output is one-half that of the trigger signal TP (i.e., 16:8). Correspondingly, the $C_2$ output of AND gate 18 is one-half that of C1 (i.e., 8:4), and in a similar manner $C_3$, the output of AND gate 20, is one-half that of $C_2$ (i.e., 4:2). Finally, $C_4$, the output of AND gate 22 is one-half that of $C_3$ (i.e., 2:1). More importantly it should be noted that C1 provides a HIGH (OR ONE) input eight times to AND gate 24, $C_2$ provides a HIGH input four times to AND gate 26, $C_3$ provides a HIGH input twice to AND gate 28, and finally $C_4$ provides HIGH input once to AND gate 30.

The flip-flops of register 34 contains a digital ONE if their respective Q outputs are HIGH. Conversely, a digital ZERO is indicated by the LOW state at the Q output terminal.

Whenever any of the AND gates 24, 26, 28 and 30 has both inputs HIGH, then that AND gate will deliver an input to the logic OR gate 32. The gate 32 is a logic INCLUSIVE OR, so that whenever there is a HIGH (DIGITAL ONE) on any one or more of its inputs, it will deliver an output. A number of examples will serve to point up this operation.

Assume by way of illustrating that the 8–4–2–1 binary code is being utilized, and the flip-flops FF1, FF2, FF3 and FF4 are set (by any convenient means not shown) to reflect the desired intelligence.

Assume first that the register 34 contains the decimal zero which in code form is 0000. This being the case, although the trigger flip-flops (TFF's) will provide a HIGH to the AND gates to the sequence: 8–4–2–1, there will be no output because the Q of the respective flip-flops FF1, FF2, FF3 and FF4 will be LOW (ZERO). The result is that there will be no output from the OR gate 32. This is shown in FIG. 5 by the straight line (representing ground or a low potential) to the right of the decimal 0.

Assume now that the register 34 contains a decimal 3. In the 8421 code this will be 0011; thus the Q outputs of FF3 and FF4 will be HIGH. The C1 and C2 outputs will provide HIGH signals to the AND gates 24 and 26, eight and four times respectively, but no output will be delivered from the AND gates because the respective register Q inputs are low (ZEROS). When the C3 output is applied to AND gate 28, pulses will be delivered at 50 and 52; similarly, the single time that the C4 output is delivered to AND gate 30, will result in the pulse output 54. The pulse train output shown to the right of the decimal 3 in FIG. 5 will then constitute the output of the OR gate 32. The decimal 9 in 8421 code is 1001. This results in the pulse waveform output shown to the right of the number 9 in FIG. 5. Again as the respective AND gates 24, 26, 28 and 30 are interrogated in sequence, they will have an output if the Q of the flip-flop with which they are associated in HIGH. However, it will be noted that, as indicated by the identification numeral 56, there is some merging of pulses and this can produce deleterious results. This merging of pulses results from the close proximity of the C1 and C4 output pulse train. Finally, the decimal 15, which is coded 1111, will result in a full continuous output from the OR gate 32 as shown in FIG. 5. Note: the synchronized pulse shaper circuitry 12 eliminates the pulse merging problem as will be explained presently.

Figure 2:
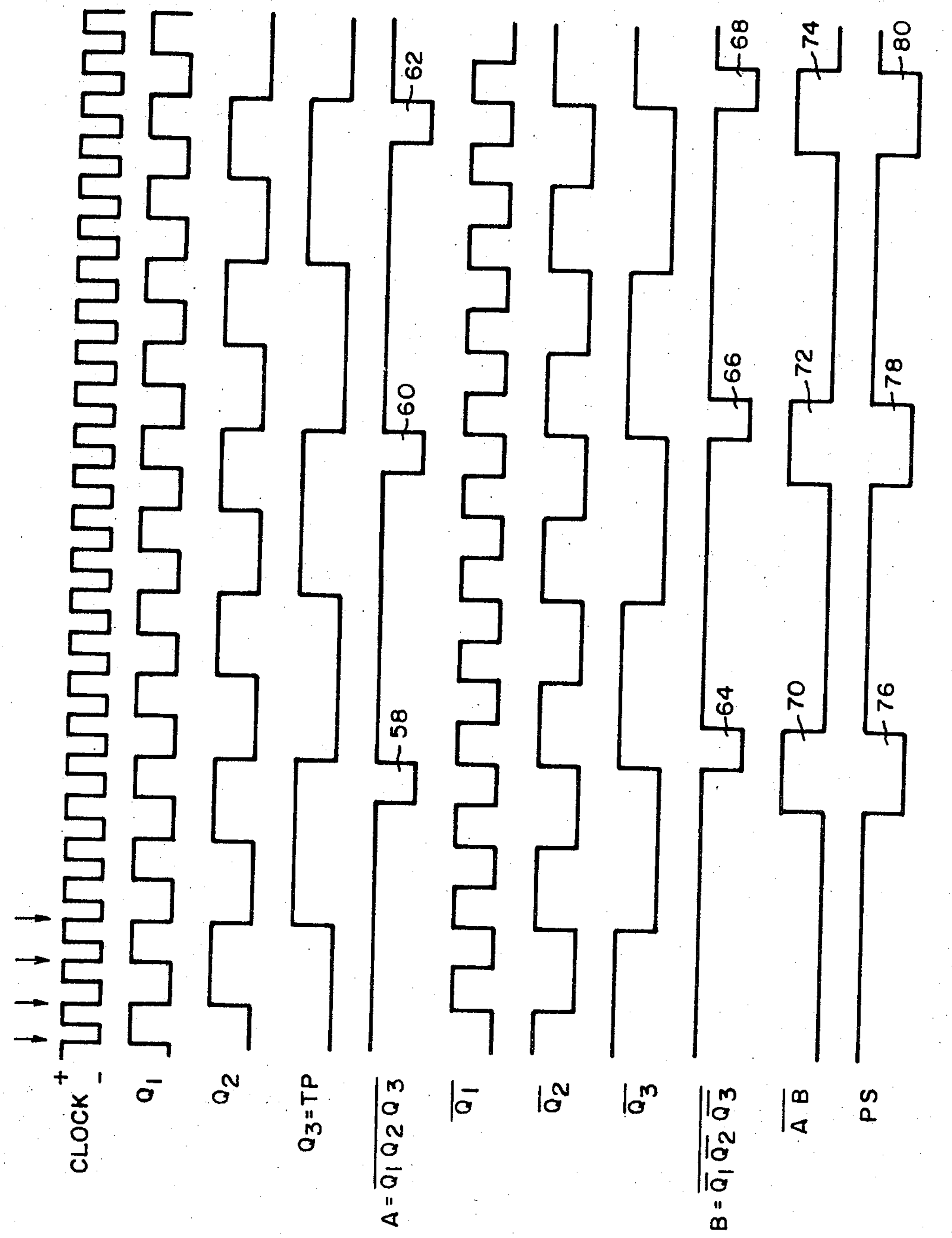
FIGS. 2 and 3 are waveforms used in explaining the operation of the circuitry of FIG. 1.
Figure 3:
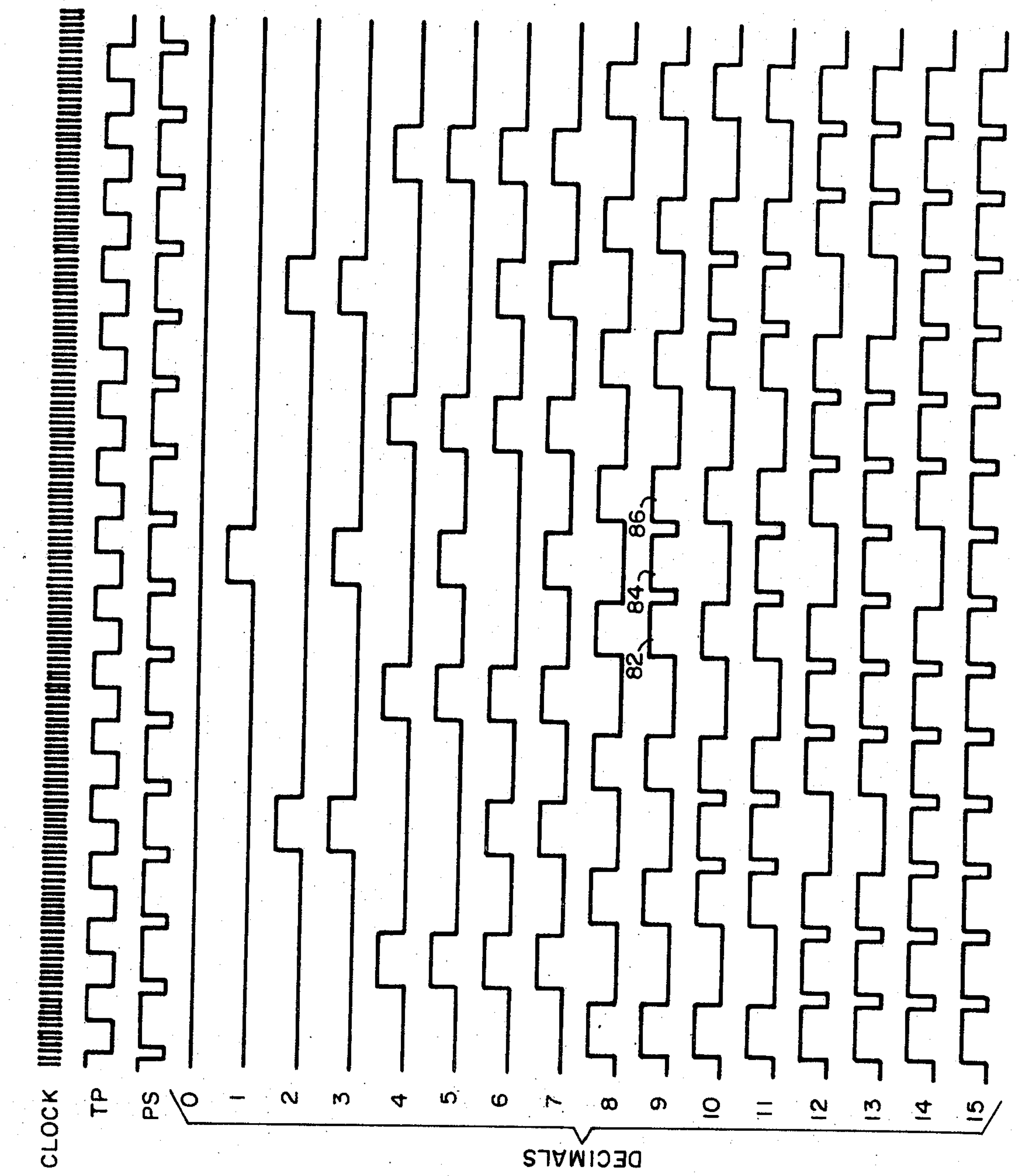

Referring now back to FIGS. 1, 2 and 3, it will be noted that the clock 36 provides a series of pulses which are applied to the JK flip-flops FF5, FF6 and FF7; these together constitute a synchronous counter as will be shown. The clock pulses are applied to the trigger terminal T of each JK flip-flops FF5, FF6 and FF7. It will be recalled that the output terminal $Q_1$ of FF5 is connected to the JK terminals of FF6 and to the AND gate 38. The output terminal $Q_2$ of FF6 is connected as an input to the AND gate 38. The output of the AND gate 38 forms the JK input to FF7.

The Q and $\overline{Q}$ outputs of the JK flip-flops are complemented. Each JK flip-flop can only change state when its JK input is HIGH (ONE) and the clock pulse is going from 1 to 0 (high to low). The application of the clock pulse to the trigger terminals T then produces the pulse train shown in FIG. 2 at: $Q_1$, $Q_2$, $Q_3$ and $\overline{Q}_1$, $\overline{Q}_2$ and $\overline{Q}_3$. The dynamics of the operation of the JK flip-flop may be appreciated from a study of the table below. Note: 1–0 means the clock pulse is moving from high to low, (negative going), 0–1 means it is moving from low to high (positive going), and 0–0, 1–1 means that the pulse remains at the same low or high potential for a time interval. The 1–0(a) and 1–0(b) notation is utilized to indicate the initial state of the JK input of the respective flip-flop when the trigger pulse is applied, and when the trigger pulse has completed its excursion from 1 to 0 respectively.

TABLE

| Clock Pulse | FF5 JK $Q_1$ | FF6 JK $Q_2$ | AND GATE $Q_1$ $Q_2$ | FF7 JK $Q_3$ |
|---|---|---|---|---|
| →1–0(a) | 1 0 | 0 0 | 0 0 | 0 0 |
| →1–0(b) | 1 1 | 1 0 | 1 0 | 0 0 |
| 0–0 | 1 1 | 1 0 | 1 0 | 0 0 |
| 0–1 | 1 1 | 1 0 | 1 0 | 0 0 |
| 1–1 | 1 1 | 1 0 | 1 0 | 0 0 |
| →1–0(a) | 1 1 | 1 0 | 1 0 | 0 0 |
| →1–0(b) | 1 0 | 0 1 | 0 1 | 0 0 |
| 0–0 | 1 0 | 0 1 | 0 1 | 0 0 |
| 0–1 | 1 0 | 0 1 | 0 1 | 0 0 |
| 1–1 | 1 0 | 0 1 | 0 1 | 0 0 |
| →1–0(a) | 1 0 | 0 1 | 0 1 | 0 0 |
| →1–0(b) | 1 1 | 1 1 | 1 1 | 1 0 |
| 0–0 | 1 1 | 1 1 | 1 1 | 1 0 |
| 0–1 | 1 1 | 1 1 | 1 1 | 1 0 |
| 1–1 | 1 1 | 1 1 | 1 1 | 1 0 |
| →1–0(a) | 1 1 | 1 1 | 1 1 | 1 0 |
| →1–0(b) | 1 0 | 0 0 | 0 0 | 0 1 |

As will be observed, the output of $Q_3$ is the TP input which is applied to the commutator 14 of the basic encoder 10. The various outputs $Q_1$, $Q_2$, $Q_3$ and $\overline{Q}_1$, $\overline{Q}_2$ and $\overline{Q}_3$ are applied to the NAND gates 40 and 42. The NAND gate 40 performs the operation $A = \overline{Q_1 Q_2 Q_3}$; similarly NAND gate 42 performs the operation $B = \overline{\overline{Q}_1 \overline{Q}_2 \overline{Q}_3}$.

The NAND gate 40 has a low output A only when $Q_1$, $Q_2$ and $Q_3$ are high, thus producing output pulses identified at 58, 60 and 62 respectively. Similarly, the NAND gate 42 produces a low output B only when $\overline{Q}_1$, $\overline{Q}_2$ and $\overline{Q}_3$ are high thus producing output pulses identified at 64, 66 and 68. The NAND gate 44 then performs the logic operation $\overline{AB}$ producing output 70, 72, 74, which occur whenever there is an input signal on either A or B. Thus, the pulses 58 and 64 cooperate to form pulse 70. Similarly pulses 60 and 62 cooperate to form pulse 72, and finally pulses 62 and 68 cooperate to form pulse 74. The pulses marked 70, 72 and 74 in FIG. 2, are then inverted by the logic inverter 46 to produce the pulses shown at 76, 78, 80; these pulses give a mark-space ratio of 3:1, that is the mark is three times as long as the space.

It will be observed now from a study of FIG. 2, that the PS pulses straddle the TP pulses i.e., the TP pulses change in the middle of PS so that any perturbations in rise and fall time of the TP pulses is effectively excised.

As a result of this straddling technique, the merging of pulses (as occurred at 56 in FIG. 5), has now been effectively eliminated, so that in effect, the merged pulse is split into three pulses 82, 84, 86 as indicated. It should also be noted that each decimal is now represented by discrete pulses; for example, decimal 14 is represented by 14 pulses, decimal 15 by 15 pulses, etc.

DESCRIPTION OF SECOND EMBODIMENT

For purposes of simplicity, the high resolution pulse rate modulated digital-to-analog converter system has thus far been described in connection with only four bits of information. In FIG. 6 there is shown a digital-to-analog system in a practical environment having an eight-bit register plus a sign bit.

Referring now to FIG. 6 the register 88 is arranged to handle eight bits in addition to a sign bit (S.B). The lower bits in the register are identified at $2^0$, $2^1$, $2^2$, and $2^3$, and the upper bits are indicated at $2^4$, $2^5$, $2^6$, and $2^7$. The lower bits are connected to a pulse binary comparator 90, and the upper bits are connected to a similar pulse binary comparator 92.

A clock 94 is applied to a synchronized pulse shaper circuit 96, which in cooperation with a commutator 98 interrogates the pulse binary comparators 90 and 92.

The sign bit in the register 88 is connected to logic AND gates 100, 102 and to a logic inverter 104, the output of the amplifying inverter 104 being connected to logic AND gates 106 and 108. The outputs of AND gates 100, 102, 106 and 108 are connected to analog switches 110, 112, 114 and 116 respectively. The analog switches 110 and 112 are connected to a positive voltage reference $+Vr$, while the analog switches 114, 116 are connected to a negative source of potential $-Vr$. The output of the analog switches 110, 112, 114 and 116 are applied through a resistive-capacitive network 118, 120, 122 and 124 respectively, and as will be observed from the drawing the resistors have the magnitudes R and $2^4$R. Capacitors (unidentified by number) are connected between the mid-point of the resistors and ground to provide additional filtering.

The networks 118, 120, 122, 124 are connected in common to an operational amplifier indicated generally at 126. The operational amplifier has a feedback path with a resistor 128 and a capacitor 130 to provide an averaging output at the terminal 132. Note the system can also be used in a binary coded decimal (BCD) digital-to-analog converter system. The resistive network has the magnitudes indicated because the information in the register is in binary form; had the information been in BCD form the value of the resistors would have been 10R instead of $2^4$R.

OPERATION OF THE SECOND EMBODIMENT

In the field of the numerical control of machine tools, the digital-to-analog converter system of the instant invention finds particular utility. For example, it is desired to control the rotational velocity of a d-c motor which responds only to an analog voltage. A series of command signals, calculated by computer or predetermined in advance, are arranged in binary coded form in the register 88. The objective of the digital-to-analog converter system then will be to convert the coded signals to analog form at the output 132 for application to the d.c. motor.

The register 88 contains provision for a sign bit. If the sign is positive, AND gates 100 and 102 will receive an input, and if the other two inputs are present it will provide a pulse output train to the respective analog switches 110 and 112. Similarly, if the sign is negative, it will be inverted by the logic inverter 104, to provide one input to AND gates 106 and 108, and if the other two inputs are present will pass a pulse train to the analog switch as 114 and 116.

The operation of the synchronized pulse shaper circuitry 96 the comparator 90 and the pulse-binary comparator 90, 92 is exactly the same as their counterparts described in connection with FIGS. 1 and 2. Logic AND gates 100, 102, 106 and 106 serve the same logic function as AND gate 48 in FIG. 1.

A code number in the register 88 provides an appropriate pulse train as depicted in FIG. 3 for the decimals 0+15. Each time a pulse is applied to an analog switch, i.e., 110, 112, 114, or 116, the switch is closed connecting a reference voltage +Vr or −Vr to the operational amplifier 126 which functions as a filter, which produces an output signal which is proportional to the pulse rate. The greater the number of pulses the higher the charge on the capacitor 130, and of course the higher the analog voltage produced at 132.

The response time of the system and the ripple content of the filtered output are closely related. The harmonic content of the ripple depends upon the digital data. In general, the frequency of the lowest harmonic component of the ripple waveform should be as high as possible in order to mitigate filtering requirements. For this reason the outputs $C_1$, $C_2$, $C_3$, $C_4$ of the commutator 98 are shared by two pulses - binary comparators 90 and 92; this means that the two comparators 90, 92 pass through the same sequence, but handle four different bits of input data.

The two pole filter is used in order to obtain the desired ripple reduction and to improve the settling time of the digital-to-analog converter system.

It will therefore be apparent that there has been described a high resolution pulse rate modulated digital-to-analog converter system having wide application for industrial use, particularly in the field of the numerical control of machine tools.

We claim as our invention:

1. A digital to analog converter system comprising:

commutator means providing interrogating pulses in a predetermined sequence;

comparator means for comparing said interrogating pulses with binary digital data located in stored digital intelligence means to ascertain coincidence, and for delivering intermediate encoded digital pulses which are a function of said binary digital data;

synchronized counter means coupled with said comparator means to enable synchronization;

logic circuitry means adapted to receive the output of said synchronized circuit means for logic operations thereon to provide synchronized pulses which are synchronized with said intermediate encoded digital pulses, each synchronized pulse having a time width duration which is less than and wholly contained within the time width duration of the corresponding intermediate encoded digital pulses;

means for logically AND gating said intermediate encoded digital and synchronized pulses and delivering a digital pulse train output which is a function of said binary digital data;

analog switching means having on and off positions adapted to be selectively connected to positive or negative voltage sources respectively, and operatively connected to said logic AND gating means, the digital pulse train output providing selective actuation of said analog switching means;

weighted resistor network means connected to said analog switching means, and adapted to be selectively energized by said voltages through said analog switching means;

operational amplifier means having a capacitor and a resistor connected in parallel in the feedback path thereof, said operational amplifier means being coupled to such weighted resistor network means, the output of said operational amplifier means delivering an analog signal.

2. A digital-to-analog converter system comprising:

means for generating intermediate encoded digital pulses which are a function of binary digits located in stored digital intelligence means, comprising commutator means for providing interrogating pulses in a predetermined ordered sequence;

comparator means for comparing said interrogating pulses with said binary digits in said stored digital intelligence means to ascertain coincidence, comprising first logic AND gating means, EXCLUSIVE OR gating means, said first logic AND gating means having one input connected to said binary digits and the other connected to receive said interrogating pulses, the outputs of said first logic AND gating means being applied to said EXCLUSIVE OR gating means which delivers said intermediate encoded digital pulses;

means for generating synchronized pulses which are synchronized with said intermediate encoded digital pulses, each synchronized pulse having a time width duration which is less than and wholly contained within the time width duration of the corresponding intermediate encoded digital pulse;

second logic AND gating means for AND gating said intermediate encoded digital and synchronized pulses and delivering a digital pulse train output which is a function of said binary digits; and means for receiving and filtering said digital pulse train output to deliver an analog signal.

3. A digital-to-analog converter system comprising means for generating intermediate encoded digital pulses which are a function of binary digits located in stored digital intelligence means;

means for generating synchronized pulses, which are synchronized with said intermediate encoded digital pulses, each synchronized pulse having a time width duration which is less than and wholly contained within the time width duration of the corresponding intermediate encoded digital pulse;

means for logically AND gating said intermediate encoded digital and synchronized pulses and delivering a digital pulse train output which is a function of said binary digits; and means for receiving and filtering said digital pulse train output to deliver an analog signal, comprising analog switching means having on and off positions, weighted resistor network means, and filtering means, said analog switching means being adapted to be connected selectively to positive and negative voltage sources and to said second logic AND gating means, the digital pulse train output providing selective actuation of said analog switching means, the weighted resistor network being adapted to be selectively energized by said voltage sources through said analog switching means, said filtering means being connected to said weighted resistor network to deliver said analog signal.

4. A digital-to-analog converter system comprising means for generating intermediate encoded digital pulses which are a function of binary digits located in stored digital intelligence means;

means for generating synchronized pulses, which are synchronized with said intermediate encoded digital pulses, each synchronized pulse having a time width duration which is less than and wholly contained within the time width duration of the corresponding intermediate encoded digital pulse;

means for logically AND gating said intermediate encoded digital and synchronized pulses and delivering a digital pulse train output which is a function of said binary digits; and means for receiving and filtering said digital pulse train output to deliver an analog signal, comprising analog switching means having on and off positions, weighted resistor network means, and filtering means, said analog switching means being adapted to be connected selectively to positive and negative voltage sources and to said logic AND gating means, the digital pulse train output providing selective actuation of said analog switching means, the weighted resistor network being adapted to be selectively energized by said voltage sources through said analog switching means, said filtering means comprising operational amplifier means having a capacitor and a resistor connected in parallel in the feedback path thereof, and being connected to said weighted resistor network to deliver said analog signal.

* * * * *